United States Patent [19]

Williams

[11] Patent Number: 4,853,928
[45] Date of Patent: Aug. 1, 1989

[54] AUTOMATIC TEST GENERATOR FOR LOGIC DEVICES

[75] Inventor: Wayne R. Williams, Boulder, Colo.

[73] Assignee: Hewlett-Packard Company, Palo Alto, Calif.

[21] Appl. No.: 90,869

[22] Filed: Aug. 28, 1987

[51] Int. Cl.$^4$ .............................................. G01R 31/28
[52] U.S. Cl. ......................................... 371/15; 371/27
[58] Field of Search ...................... 371/15, 27, 25, 20; 324/73 R, 73 AT

[56] References Cited

U.S. PATENT DOCUMENTS

| | | | |
|---|---|---|---|
| 4,204,633 | 5/1980 | Goel | 371/21 |
| 4,601,032 | 7/1986 | Robinson | 371/23 |
| 4,692,921 | 9/1987 | Dahbura | 371/15 X |
| 4,696,006 | 9/1987 | Kawai | 371/27 |

Primary Examiner—Jerry Smith
Assistant Examiner—Robert W. Beausoliel
Attorney, Agent, or Firm—William W. Cochran, II

[57] ABSTRACT

An algebraic recursion process is defined to solve test conditions for sequential and combinatorial logic devices. The process is shown to be effective in identifying external pin faults, and is valid for in-circuit test conditions. Since only external pin faults are considered, there is no issue of the correspondence of Boolean products to the internal architecture of the device. Processes to identify the fault detection equation and initialization sequence are described and an effective minimization process presented. Functions simple enough to be implemented by logic networks fall within a range which is computationally tractable by the process of the invention.

11 Claims, 6 Drawing Sheets

AUTOMATIC TEST GENERATOR FOR LOGIC DEVICES

BACKGROUND OF THE INVENTION

1. Field of Invention

The present invention pertains generally to automatic test techniques for semiconductor state machines or logic devices, the outputs of which are a function of their previous state as well as their inputs, and more specifically to a process for automatically generating tests by an algebraic recursion technique which is suitable for any device capable of being described by Boolean state equations.

2. Description of the Background

There are two primary approaches to automatic test generation (ATG) for sequential networks. First, the topological technique which works at the gate level of a logic network and involves schematic traversal of the internal architecture of the device in order to sensitize an output to a fault. Secondly, the algebraic technique is independent of a particular architectural implementation the device functionality is concerned only with external pin faults. The topological process has previously been used to generate tests for combinatorial logic devices but there has been no general solution for sequential devices, as the problem of initialization (setting the internal registers of a logic device to a known state) has been viewed as intractable, due to the large number of possible previous states of a device. An automated algebraic test process to identify static pin faults for sequential logic devices, in circuit, would greatly speed test development and be valuable for implementing designs which are testable.

REPRESENTATION AND FEATURES OF LOGIC DEVICES

The function of a logic device can be expressed by a set of Boolean sum-of-product equations (the device Boolean state equations) for each output of the device. Other forms of representation for these devices include truth tables and state diagrams. However to use the process of the present invention these other representations must be converted to Boolean state equations. For complex logic devices, there are features that the in-circuit test program generator must address to develop a complete test solution. These features are implemented in newer logic devices containing configurable macro cells. When macro cells are present, a device pin may be programmed as an input, output, or bi-directional line. A variety of options also exist for configuring an output. An output may be combinatorial or registered. If the output is registered, asynchronous control functions such as clear, set, and output enable may be asserted when pre-defined product terms are logically true. Additionally, the clock for a register may be defined by a unique product term. All these features present challenges for automatic test generation of these devices.

THE TESTING PROBLEM

In general, static pin faults can be identified if several conditions are met. First, a state of the device must be established where an output pin is made to be a direct function of a particular input. For a combinatorial logic device this state can be established using only inputs. Sequential devices, however, may require internal registers to be set at specific values. When this is the case, an initialization sequence must be determined to initialize, or set, the internal registers of the device to the desired pre-determined state.

The D algorithm process has been presented as a general solution for combinatorial networks by Roth, J. P, "Diagnosis of Automata Failures: A Calculus and a Method," IBM J. Res. Dev., vol. 10, no. 4 July 1966, pp. 278-291, but no such claims of generality exist for the sequential case. An overview of automated test generation techniques for sequential networks is provided by Miczo in Miczo, A., "Digital Logic Testing and Simulation, "New York: Harper & Row., 1986, chap. 3 One example is Hsiao's method of Boolean differences, which applies Boolean algebra to address the test problem for sequential networks (Hsiao, M. Y., and D. K. Chia, "Boolean Difference for Fault Detection in Asynchronous Sequential Machines," IEEE Trans. Comput. vol. C-20, November 1971, pp. 1356-1361). The method of Boolean differences successfully defines a state of the network which can detect a fault, but proposes no general approach to initialize the network to a desired state so that a test can be accomplished. The goal of automatic test generators is to isolate static pin faults that can be identified in either in-circuit or out of circuit test environments. Manual test generation for sequential logic devices can be extremely time consuming, so an automated solution is desired to simplify and speed test development. Automatic test generators exist for certain combinatorial logic devices, however, there is no general automated test generation solution for sequential logic devices.

SUMMARY OF THE INVENTION

The present invention over comes the disadvantages and limitations of the prior art by providing an algebraic process of test generation for logic devices described by Boolean state equations. The process of the present invention presents a general solution to the initialization problem useable for all the classes of combinatorial and sequential logic devices or clusters of these devices. The only restriction on the initialization sequence is that the first transistion of the sequence must occur independent of the state of the device. The process provides a method of first determining if a device meets conditions necessary for testing to proceed. If a test is possible the process will quantitatively identify all stuck-at-one and stuck-at-zero external pin faults for an input and output of interest. The process also provides a large degree (though unquantified) of test coverage for internal faults. The process provides automatic tests for combinatorial and sequential logic devices, can be used with either synchronous or asynchronous registers and can be adapted to the in-circuit topology of the logic device. The only restriction is that the device must be describable in Boolean state equations and meet the necessary and sufficient conditions for a test. The test generation process of the present invention is successful in generating test for many commercial logic device designs in a high volume custom test development environment. An important contribution of the process is a solution to the initialization problem of a sequential network.

DETAILED DESCRIPTION OF THE INVENTION

Figure 1:
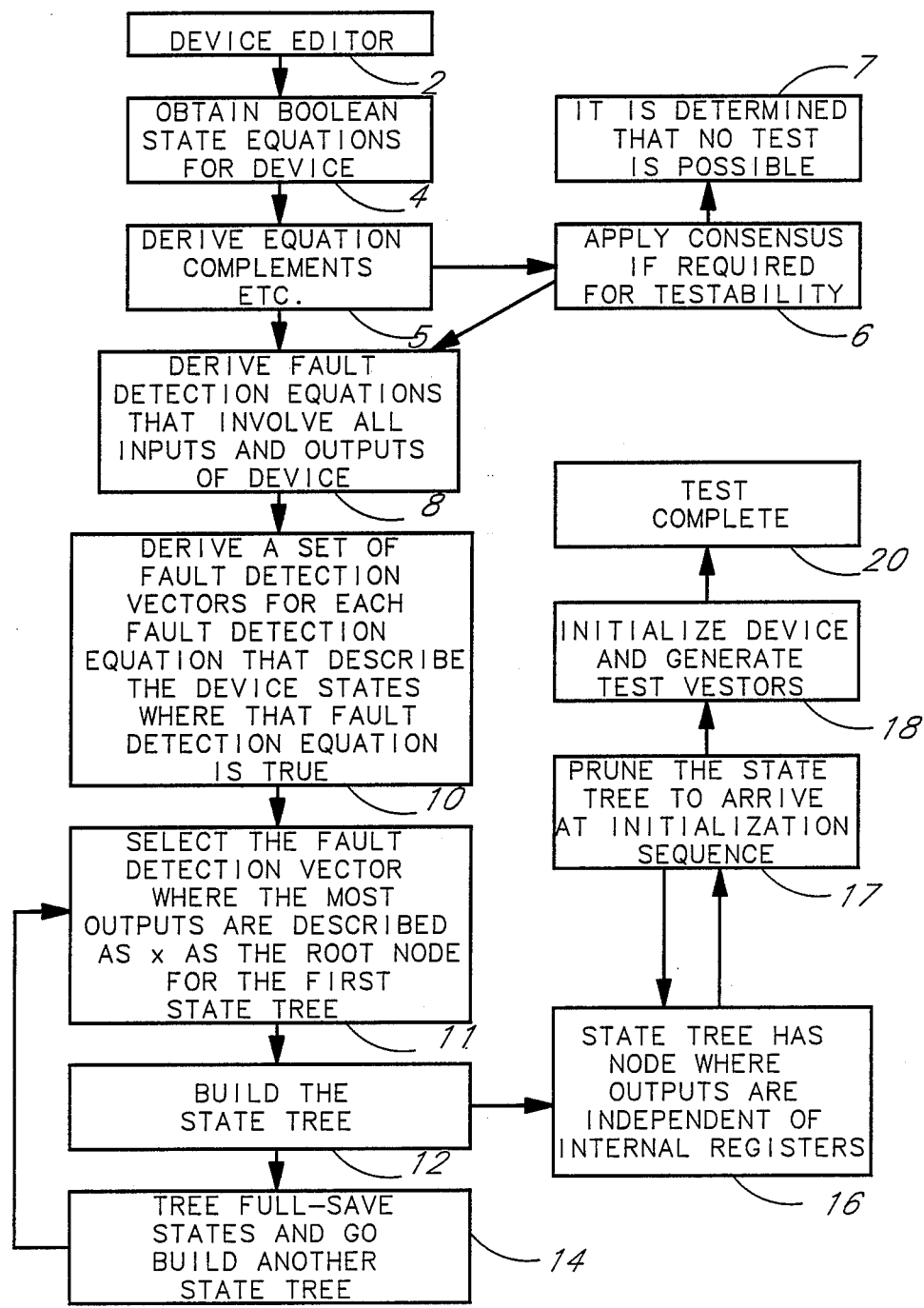
FIG. 1 is a schematic flow chart of the process of the present invention.

Before describing the process in detail the following terminology and techniques are defined:

PRODUCT VECTORS

A basic structure used to describe a logic device is the Boolean product. A form of the Boolean product which is convenient for computational manipulation is the product vector. A product vector is an assignment $(x_1, \ldots, x_n, y_1, \ldots, y_m) = (e_1, e_2, \ldots e_{m+n})$ where x refers to primary inputs, y refers to primary outputs, and e is an element of the set: $\{1,0,x\}$ A 1 indicates that a term is asserted when it is logically true. A 0 indicates that a term is asserted when it is logically false. An x indicates a "do not care" for a term, in other words, a term indicated by x may be either 1, or 0, and the logic of the device is unaffected and therefore a term represented by an x is logically irrelevant. Inputs and outputs mean inputs and outputs external to the device. In general, inputs and outpus mean primary inputs and outputs. As an example the state equation for a j-k flip flop is:

$$q(t+1) = j*/q(t) +/k*q(t)$$

The product vectors for q(t+1) are: j, k, and q Rewriting the q(t+1) equation using product vectors gives:

$$q(t+1) = (1,x,0) + (x,0,1)$$

In this example each product vector is comprised of three elements. The first two elements refer to j and k respectively (primary inputs), and the third element refers to q (the primary output).

THE INTERSECTION OF TWO PRODUCT VECTORS

The Boolean AND of two products is easily implemented with product vectors by defining the following intersection table where an n indicates null.

|   | 1 | 0 | x |
|---|---|---|---|
| 1 | 1 | n | 1 |
| 0 | n | 0 | 0 |
| x | 1 | 0 | x |

For example, assuming two inputs and one output, the AND of the two Boolean products:

$$(j*q(t))*(/k) = j*/k*q(t)$$

is realized in terms of product vectors by intersecting (1,x,1) with (x,0,x) to obtain (1,0,1).

The AND of the two Boolean products:

$$(j*q(t))*(/j)$$

is null, and is realized in terms of product vectors by intersecting (1,x,1) with (0,x,x) to obtain the null product vector. The null product vector indicates that the intersection does not exist. In general the term intersection refers to product vectors, and the term AND refers to Boolean products.

CONSENSUS

Another important Boolean operation is the consensus operation which is based on the theorem $xy+/xz=xy+/xz+yz$. Consensus is used to derive the redundant product yz. The consensus operation is easily implemented using product vectors. Consensus, if it exists, between two product vectors v1 and v2 of function F will produce a third product vector v3, and is defined in the following fashion. A term must be present in both v1 and v2 in complemented form, (i.e., 0 and 1 for the same term in separate product vectors). The remaining elements of v1 and v2 are intersected. If this intersection is not null then it is a valid product vector of the function F.

As an example, consider two product vectors of a function F: (1,1,0) and (0,x,0). The first term is present in both product vectors in complemented form, and the product vectors may be rewritten as (x,1,0,) and (x,x,0). Perform the intersection of (x,1,0), and (x,x,0) and obtain (x,1,0). The product vector (x,1,0) is not null and therefore is a valid product vector of the function F.

COVERING

Finally, the concept of covering which is based on the theorem x+xy=x. Covering is used to eliminate redundant products from a Boolean function. Covering is an important tool for the construction the state tree. A product vector v1 is said to cover product vector v2 if v1 can be converted to v2 by changing the appropriate x's to either a 1 or a 0. For example (x,0,x,x) covers (x,0,x,0), so by applying covering, two product vectors can be represented by the single product vector (x,0,x,x) without any loss of information relative to the function they describe.

AN OVERVIEW OF THE ALGEBRAIC RECURSION PROCESS

FIG. 1 shows a schematic of flow diagram of the process. The device editor 2 allows for entry and editing functions relative to the description of the device and is not the subject of the invention. The next section are pre-processing activities 4 & 5 where the device state equations and their complements are derived. If required for testability consensus is applied to the state equations in step 6 and if necessary conditions are not met the process is terminated 7 and the device is not testable.

The next step of the process is the derivation of fault detection equations 8 which involve all of the input-output pins of the device. When this is complete fault detection vectors are derived, in step, 10 for each fault dection equation that describe device states where that fault detection equation is true.

Selecting, in step 11, the fault detection vector where the most outputs are designated as x for the root node of the first state tree constructed in step 12. If the tree is full before arriving at a state where the outputs are independent of the internal registers of the device return to step 11, choose another fault detection vector and build a new tree. Repeat this process until a node is found is found to be independent of the device internal registers 16 or it is determined that no such node exists in which case the device is not testable. As each state tree is built it is pruned using pruning techniques 17 so that initialization sequences are determined so that the device internal registers may be set 18 inorder to allow testing to proceed 20.

PRE-PROCESSING OF DEVICE DESCRIPTORS

The goal of pre-processing, steps 4, 5, 6 & 7 is to determine the minimized logic true and logic false equations for each output of the device. Additionally, the equation must be adapted to reflect board topology. Also, it is necessary to determine core terms which identify the possibility of a test using this process.

DERIVATION OF MINIMIZED LOGIC TRUE/FALSE DEVICE STATE EQUATIONS

The representation for each output of the device is in the form of a Boolean state equation. The sense of the equation will be either logic true or logic false. The complement of each equation is then derived. This can be accomplished by applying DeMorgan's theorem, and then minimizing the resultant expression according to the technique described by McCluskey (McCluskey, E. J. JR., "Introduction to the Theory of Switching Circuits," New York: NMcGraw-Hill Book Co., 1965, Chap 4). The minimized logic true and false equations are needed for each output of the device; these equations are used to construct the state tree. Additionally the equations for any buried registers of the device are necessary. A buried register is any register the output of which is not available at an external pin of the device.

Figure 2:
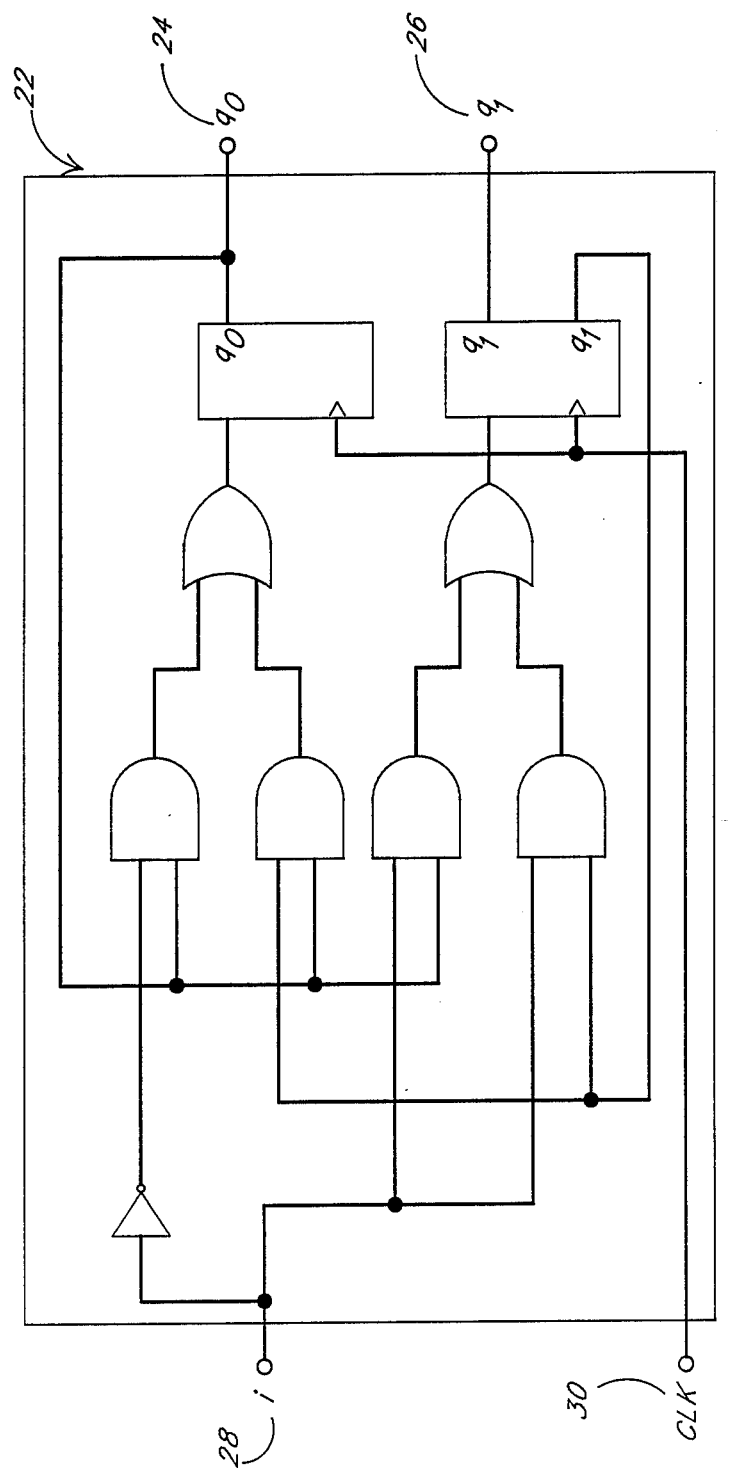
FIG. 2 is a schematic diagram of a typical logic device having one input, two outputs and a clock.

For illustration purposes FIG. 2 shows a typical one input, two output device, designated device 22. Device 22 has two registered outputs designated q0 (24) and q1 (26) and one input designated i (28), a clock 30 and is described through the following Boolean equations:

$$q0(t+1) = /i*q0(t) + q0(t)*/q1(t)$$

$$q1(t+1) = i*/q1(t) + i*q0(t)$$

Typically the Boolean logic equations will be specified by the manufacturer so that derivation of these is not necessary unless the device is described by an alternate state description. Deriving the minimized Boolean expressions using DeMorgans theorm for /q0(t+1), and /q1(t+1) gives:

$$/q0(t+1) = i*q1(t) + /q0(t)$$

$$/q1(t+1) = /i + /q0(t)*q1(t)$$

This information can be represented using product vectors as follows:

q0 (logic true): {(0,1,x), (x,1,0)} q0 (logic false): {(1,x,1), (x,0,x)} q1 (logic true): {(1,x,0), (1,1,x)} q1 (logic false): {(0,x,x), (x,0,1)}

ADAPTATION OF EQUATIONS TO TOPOLOGY

Through the use of jumpers or fixed traces, the device may appear on the printed circuit assembly in a different form than the device appears when it is not connected to other circuit components (all pins free case).

This can be done by tying inputs to a predetermined state. The device equations are easily modified to reflect these modifications by noting the algebraic implications of tied input lines. For example, a product term containing a logic true form of an input pin will disappear if that pin is tied low. The general procedure for each stuck-at condition on an input pin is as follows. Consider a stuck-at logic level 1 on an input pin i. Also consider each product vector from the set which represents the minimized logic true and logic false equations of the device. For each product vector where the ith element is not an x, the following modification is required:

(1) If the ith assignment is 1 the assignment is changed to an x.

(2) If the ith assignment is /1 the product vector disappears.

(3) If (i) is true and all other elements of a product vector are assigned an x then that output state is always true.

IDENTIFYING NECESSARY CONDITIONS FOR A TEST

Now it is possible to identify necessary but not sufficient conditions for test generation to be possible by the process of the invention. At least one of the product vectors representing the logic true and logic false minimized Boolean equations for the registered outputs of the device must contain all x's (do not care or logically) irrelevant for the output assignment of that product vector. If the output assignment of one of the product vectors is represented by all x's then an output can be set true or false using only inputs. If none of these product vectors meet these requirements, consensus may be applied to the product vectors of each equation relative to outputs to derive additional Boolean products describing a given equation. These expanded product vectors of the device are referred to as the logic true and logic false core terms of the device. If none of the product vectors which represent the logic true or logic false core terms of the device contain all x's relative to their output assignment, then the device is untestable by the process. This provides a basis for design-for-testability rules when designing logic devices. The only exception to this constraint is the case where registers are provided with a set or clear function.

For device 22 we see that the product vector (0,x,x) has an x assignment for each of its outputs, and therefore we have necessary but not sufficient conditions for our algorithm to generate a test.

An example of a device that cannot be tested by this process is a simple counter which contains no primary inputs except for the clock, and is therefore exclusively a function of its previous state. Fortunately, most practical designs allow for an initialization sequence to bring a state machine to a known state. The state tree is presented as the means to determine this sequence relative to the process of the invention.

DETERMINING FAULT DETECTION EQUATIONS

Before constructing the fault detection equations for Device 22 a new element, e, which can comprise a product vector, is used to exclude a product vector which contains a non x assignment for a particular input of interest. This is necessary inorder to eliminate the possibility of setting the state of the device with the input of interest. Expanding the definition of the intersection of two product vectors gives:

|   | 0 | 1 | x | e |
|---|---|---|---|---|
| 0 | 0 | n | 0 | n |
| 1 | n | 1 | 1 | n |
| x | 0 | 1 | x | e |
| e | n | n | e | u | where u is undefined.

To generate the fault detection equations for device 22 the state equations for device 22 must be available they are:

$$q0(t+1) = /i*q0(t) + q0(t)*/q1(t)$$

$$q1(t+1) = i*/q1(t) + i*q0(t)$$

The device can be completely tested if the requirements of the following fault detection equations are satisfied.

$$q0(t+1) = /i$$

$$q1(t+1) = i$$

Beginning with $q0(t+1) = /i$ the goal is to find the set of assignments of $q0(t)$ and $q1(t)$ such that $q0(t+1) = /i$. This is done by selecting an arbitrary Boolean product of $q0(t+1)$ which contains the input of interest, and denote this as the primary Boolean product. For device 22, the input of interest is i, and the primary product is $/i*q0(t)$. A product vector is then constructed from this primary Boolean product to obtain: (0,1,x). The assignment for i is changed to e (to exclude the input of interest) and obtain (e,1,x). This is called the primary product vector.

The remaining products of $q0(t+1)$ are called secondary Boolean products. A function is constructed which is a sum of these secondary products. DeMorgan's theorem is applied to this function and the resultant expression is minimized to obtain the minimized secondary Boolean products. For Device 22 this function is given by:

$$q0'(t+1) = q0(t)*/q1(t)$$

Applying DeMorgan's theorem and minimizing, gives:

$$/q0'(t=1) = /q0(t) + q1(t)$$

The secondary product vectors are constructed next represent by $/q0'(t)$ and called the secondary product vectors. The next step in the derivation of the fault detection vectors is to intersect the primary product vector with each of the secondary product vectors. Consensus is applied with respect to the output assignments of the product vectors which result from this intersection. The set of resultant product vectors are called the fault detection Boolean products for the fault detection equation $q0(t+1) = /i$ referenced to the primary product. This set of fault detection Boolean products can be represented by a set of product vectors that are called the set of fault detection vectors. Note that another unique set of fault detection vectors may exist for other products in the fault detection equation which contain the input of interest.

Notice that this approach gives the complete set of fault detection Boolean products which satisfy the requirements of the fault detection equation $q0(t+1) = /i$. This is important because an initialization sequence that does not exist for one of the fault detection vectors might exist for another. If the output assignments for any of these fault detection vectors contain all x's, then no initialization sequence is required, and this product vector will set the state of the device.

The next step in deriving fault detection vectors device 22, is to intersect (e,1,x) with (x,0,x) and (x,x,1), to obtain (e,1,1). There is no opportunity to apply consensus (the outputs do not contain complements), and the set of fault detection vectors becomes (e,1,1).

Finally proceed to the fault detection equation $q1(t+1) = i$. Selecting $i*/q1(t)$ as the primary product, the set of fault detection vectors is given by (e,0,0). Select $i*q0(t)$ as the primary product the set of fault detection vectors is: (e,1,1).

One special case exists where an equation is a function only of outputs. To test this output, find a fault detection equation of the form $qn(t+1) = f(qm(t))$, where $qm(t)$ is an arbitrary output of which $qn(t+1)$ is a function. For example, consider the following equation for a one input, three output device:

$$q0(t+1) = /q2(t)*q0(t) + q0(t)*/q1(t)$$

In order to find the set of fault detection vectors which satisfy the fault detection equation $q0(t+1) = /q2(t)$, construct the primary and secondary product vectors according to the rules previously described and obtain the fault detection vector: (x,1,1,x). If an initialization sequence exists for (x,1,1,1), and (x,1,1,0), then q0, and q2 are fault free. If this search is not successful, then construct new fault detection equations of the form:

$$q0(t+1) = f(q0(t))$$

$$q0(t+1) = f(q1(t))$$

until a pair of fault detection vectors are derived for which an initialization sequence exists.

DERIVING THE INITIALIZATION SEQUENCE

Figure 6:
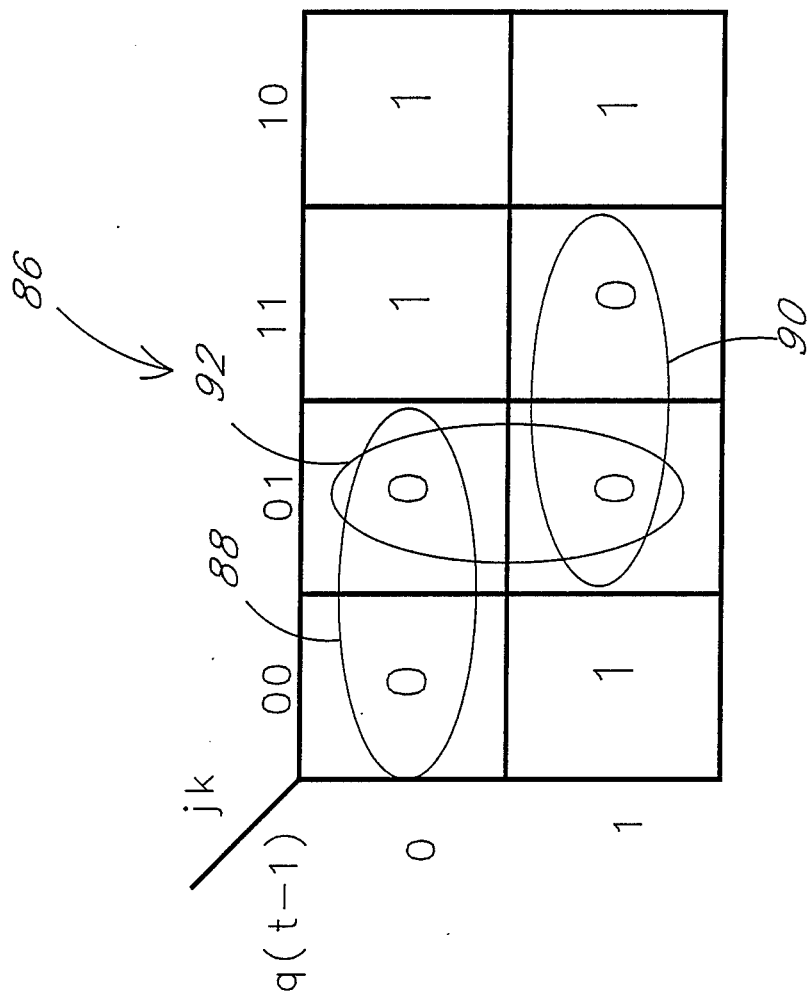
FIG. 6 is a Karnaugh map for a j-k flip-flop and illustrates the concepts of minimization and consensus.

A mechanism to define an initialization sequence for a given fault detection vector is the state tree, which is a structure that defines previous states of a logic device in order to find a transition state of a given initialization sequence which can be initiated independent of the state of a given machine. An initialization sequence will be found, if it exists, where the first transistion of that sequence can be initiated independent of the state of the device. In other words, the outputs of the product vectors are x's or do not care (logic irrelevant), such as illustrated by node 84 of FIG. 6 which is the first transistion of the initialization sequence.

THE STATE TREE

Figure 3:
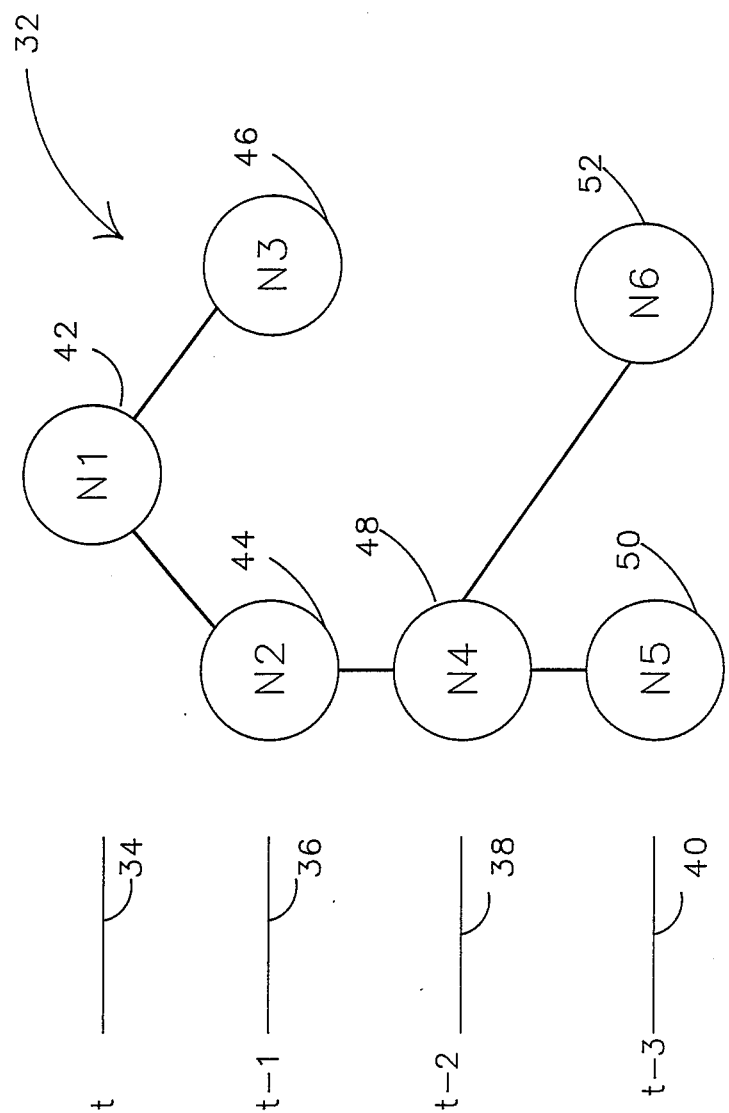
FIG. 3 is a schematic diagram of a generic state tree depicting the relationship between successor states and predecessor states (N2,N3 are successor states to predecessor N1 etc.).

The general form of the state tree 32 is illustrated in FIG. 3. Each level 34, 36, 38, 40, of the tree 32 corresponds to a discrete increment of time. A node such as nodes 42, 44, 46, 48, 50, 52, of the tree is referred to as a state node and represents a state of the device. A state node has the form of a product vector. The root of the state tree is shown as node 42 and is a fault detection vector. The children of a state node are termed the predecessor states possible for that node. The parent of a state node is termed the successor state.

From FIG. 3, node 44 (N2), and node 46 (N3) are the predecessor states of node 42 (N1). If node 41 (N1) exists at time t, nodes 44 & 46 (N2,N3) are possible states at time t−1, and node 42 (N1) is the successor state of nodes 44 and 46 (N2 & N3). The significance of this relationship is that the device will transition to node 42 (N1) from either node 44 or node 46 (N2 or N3), through one clock cycle of the registers defined in node 42 (N1). The relationship between predecessor states to a successor state is similar to the relationship of logic high and logic low core terms to a function. If a predecessor state exists, where each output assignment is an x, a transition can take place in the state tree independent of the state of any registers of the device.

APPLYING THE STATE TREE

In order to derive an initialization sequence a state tree must be constructed from pevious device states, until a predecessor state is found which contains all x's (logic irrelevant terms) for its output assignment, unless it is determined that no such predecessor state exists. If such a predecessor state exists, then an initialization sequence is defined where the first transition is independent of the state of the device.

For example consider the state tree of FIG. 3 and assume that the product vector which described node 52 (N6) contains an x for each output assignment. The initialization sequence is found by traversing the state tree from node 52 (N6) through the successor states until the root node 42 (N1), is reached. In this example, assuming a global clock is used, the inputs defined by node 52 (N6) are used to start the sequence at time t−3 represented by time level increment 40. The device is then clocked and the outputs defined by node 48 (N4) are observed at time t−2 38 and compared with the node 48 (N4) outputs predicted by the state tree. Next the inputs as defined by node 48 (N4) are set and the device is closed to the nex time increment t−1 which will bring us to node 44 (N2). This process is repeated until reaching the root node 42 (N1). At this point a fault detection equation is affirmed.

THE CONSTRUCTION OF PREDECESSOR STATES

Choosen, is the predetermined fault detection vector (e,0,0) as the root node for the first state of device 22. Collect the logic false product vectors for /q0(t+1) and /q1(t+1):

/q0(logic false): {(1,x,1),(x,0,x)}

/q1(logic false): {(0,x,x),(x,0,1,)} intersecting /q0(t+1) with /q1(t+1) results in predeecessor states of: .(0,x,x,),(0,0,x),(x,0,1)

To illustrate another example of the construction of predecessor states consider a one-input, three-output device where the minimized logic high, and logic low product terms are given by:

$$q1(t+1) = p1(t) + p2(t)$$

$$q2(t+1) = p3(t) + p4(t)$$

$$q3(t+1) = p5(t)$$

$$/q1(t+1) = p6(t) + p7(t)$$

$$/q2(t+1) = p8(t) + p9(t)$$

$$/q3(t+1) = p10(t)$$

where p1(t) through p10(t) are Boolean products. Now to find the predecessor states of the successor state given by (x,1,0,1). Perform the Boolean AND of the minimized logic true and logic false outputs indicated by the successor state to obtain a set of predecessor state nodes. This function is given by:

$$(p1(t) + p2(t)) * (p8(t) + p9(t)) * (p5(t))$$

The resulting function is minimized to eliminate redundant predecessor state nodes. Consensus is applied to the minimized function with respect to output assignments of the product vectors which represent the minimized function to obtain an expanded predecessor Boolean expression also known as the expanded set of predecessor state nodes. Finally, the expanded set of product vectors are reduced with respect to covered output assignments to eliminate redundant terms to obtain a predecessor Boolean expression for the outputs defined by the output assignment of a successor state. The resultant product vectors are the predecessor states of (x,1,0,1). From this operation observe that if a product vector exists which can transition to its successor state independent of the state of the device, it will be present in the set of predecessor states.

To illustrate the construction of predecessor states, consider the fault detection vector (e,1,1) for device A. Begin by collecting the logic true product vectors for q0(t+1), and q1(t+1):

q0 (logic true): {(0,1,x), (x,1,0)} q1 (logic true): {(1,x,0), (1,1,x)}

Construction of the predecessor states is accomplished by intersecting q0(t+1) with q1(t+1) which results in:

{(1,1,0), (1,1,0)}

Minimizing by McCluskeys method gives:

{(1,1,0)}

There is no opportunity to apply consensus (there are no complementing output pairs) so the set of predecessor states for (e,1,1) are given by (1,1,0).

CONSTRUCTING THE STATE TREE

The state tree is constructed recursively by generating the predecessor states for each node of the tree. It is possible to construct the tree in a fashion which will give rise to a minimal initialization sequence by constructing the tree one level at a time. Only after finishing a level 34, FIG. 3, do we proceed to construct level 36, and so forth. This process is continued until a state node is found which is independent of the state of any registers of the device, or until the tree is full. A tree is full when pruning techniques prohibit further growth, and no initialization sequence exists, for any of the nodes present in that tree for a particular device.

PRUNING

The pruning techniques presented herein place restrictions on state nodes which are allowed entry to the state tree and force a finite search of previous states of the device.

The first pruning technique described is the method of redundant states which provides a reduced set of predecessor state nodes. Consider a state node 44 (N2) as shown in FIG. 3 which is already present in the state tree, and another predecessor state node 46 (N3) which is being considered for entry into the state tree. If the output assignment of the product vector represented by node 46 (N3), is the same as the output assignment for the product vector represented by node 44 (N2), then node 46 (N3) is denied entry to the state tree because it has a redundant output assignment. In the example for device 22, FIG. 4, the output assignments for node 56=(1,0) and node 60=(1,0), therefore node 60 is not allowed entry. The predecessor states are a function of the output assignment of the successor state, and therefore the value of the input assignments are not significant. The subtrees which are generated under (0,1,0) will be identical to the subtrees which are generated under (1,1,0). Therefore, the state sequencing information provided by the subtree of state node (1,1,0) adds no information beyond the sequencing data obtained from (0,1,0).

Another pruning technique comprises the concept of super states which provides a further reduction of predecessor state nodes. Consider again, in FIG. 3, the two state nodes 42 and 46 (N1 & N3) where node 42 (N1) is already present in the tree and node 46 (N3) is under consideration for for entry into the state tree. Node 42 (N1) is designated a super state of node 46 (N3) if the output assignment of node 42 (N1) covers the output assignment of node 46 (N3). As an example, if node 42 (N1) is defined by (1,0,x) and node 46 (N3) is defined by (0,0,0) then we see that the output assignment of (1,0,x) covers (0,0,0). Since node 42 (N1) is a super state of node 46 (N3) the entry of node 46 (N3) into the state tree is denied. Also note that this constraint forces an exploration of new regions of the state diagram with each new entry into the state tree. The concept of super states allows the number of potential nodes of a state tree to be reduced from 3 n to 2 n, where n is the number of outputs of the device. The base three comes from the three distinct elements 1, 0, and x which can comprise the output assignment of a product vector. Also the technique of pruning ensures a finite growth of the tree.

An additional method of pruning exists if an initialization sequence already exists which has been defined by a state tree. Then the output assignment of the product vectors which represent that initialization sequence are learned by using a standard learn hash table. When constructing future state trees and considering a state node n for entry, hash into the learn hash table to determine if the output assignment of n is present. If it is present, then merge the initialization data contained in the present state tree with the initialization data pointed to by the learn hash table.

Another method of pruning involves nodes of full trees. State nodes from full trees are learned in a similar fashion. Recall that full tree indicates that an initialization sequence does not exist for any of the state nodes which comprise that tree. When considering a state node n for entry into a current state tree, it must be determined if the output assignment of n is covered by the output assignment of a node which is part of a full tree through hashing. If n was covered by the output assignment of a node of a previous full tree, then no value is added to the current state tree by entering n.

TESTING DEVICE 22

Figure 4:
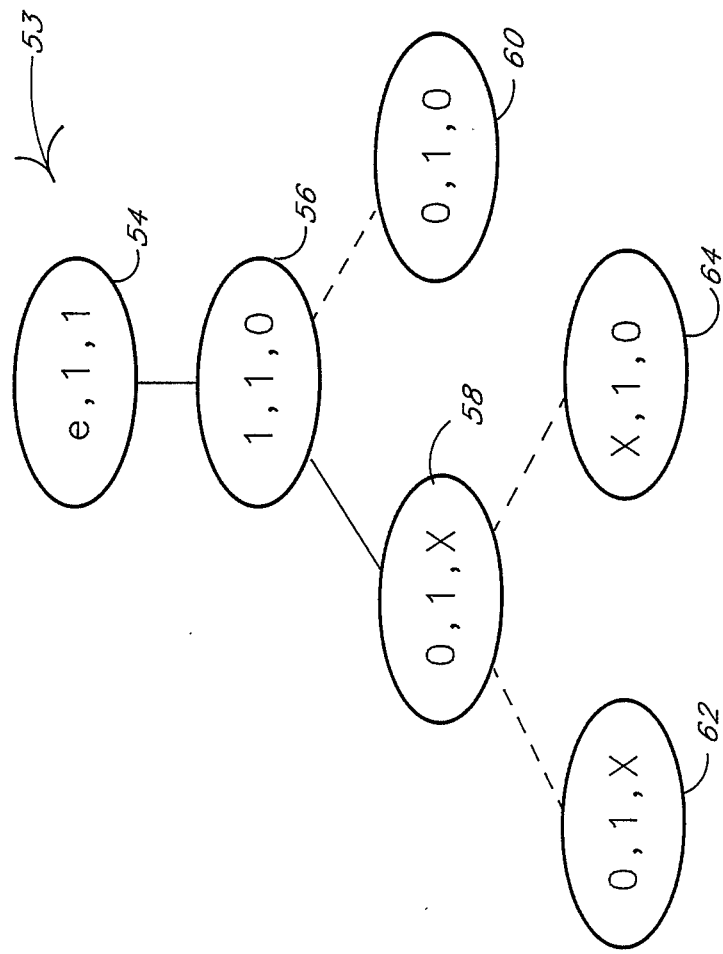
FIG. 4 is the state tree for the fault detection vector (e,1,1) and illustrates a full state tree where no initialization sequence exists.

Returning to device 22, the state tree 53 for the fault detection vector (e,1,1) is shown in FIG. 4. The state nodes 60, 62, and 64 are prohibited from entry into the tree according to the redundant state pruning constraint. Note that this state tree 53 is full, and therefore no initialization sequence exists where the first transition can be initiated independent of any internal register state.

Figure 5:
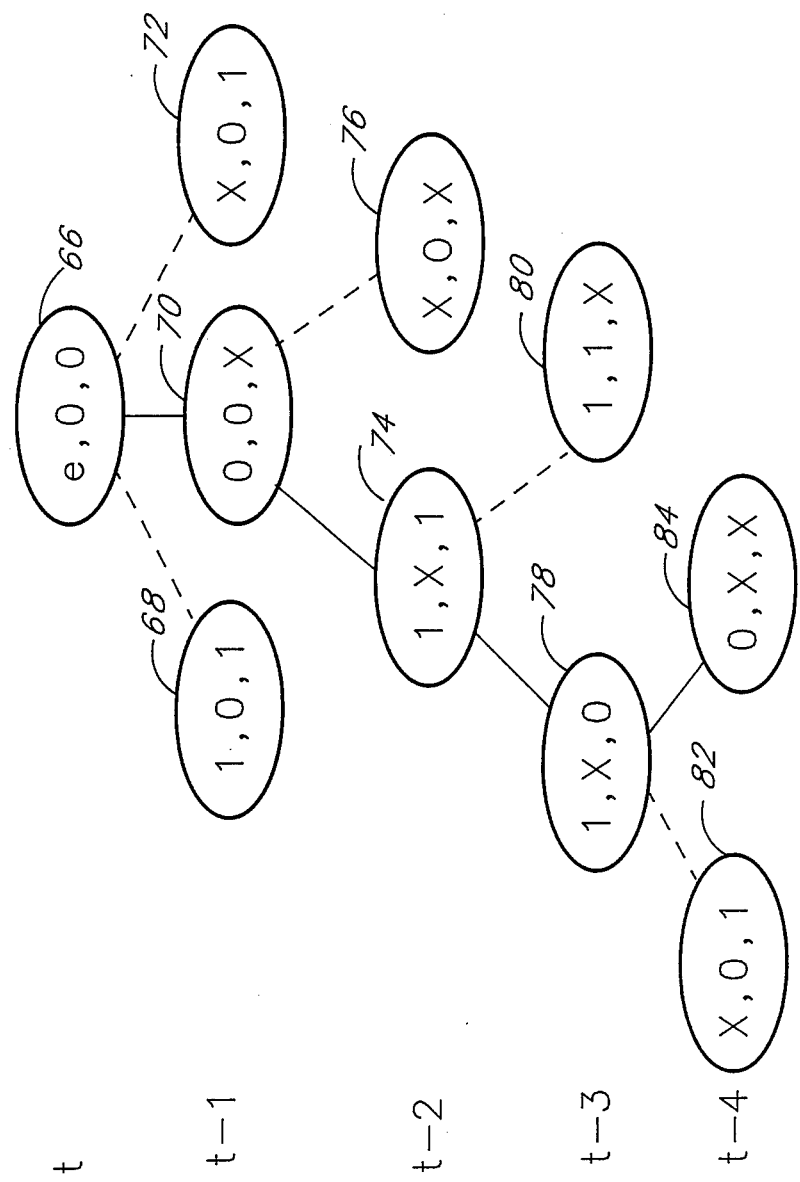
FIG. 5 is the state tree for the fault detection vector (e,0,0) and illustrates the use or the state tree to derive the initialization sequence for the fault detection vector (e,0,0).

The next step is to construct a state tree for (e,0,0) which satisfied the fault detection equation $q1(t+1)=i$. The state tree for (e,0,0) is shown in FIG. 5.

Note that the output assignment for the state node 84 is represented by all x's. Also notice that node 80 is prohibited entry into the tree because the output assignment of (1,1,x) is equivalent to the output assignment of a state node of the full tree for (e,1,1). Node 76 was not allowed entry because of the redundant state pruning constraint. Node 82 as not allowed entry because its output assignment was covered by the output assignment of node 70 (node 70 is the upper state or node 82).

The initialization sequence for (e,0,0) is easily derived by traversing the state tree from node 84 through successor states 78, 74, and 70 until reaching the root node 66. This sequence is:
1. Input 0-clock device-check $q1=0$
2. Input 1-clock device-check $q1=1$
3. Input 1-clock device-check $q0=0$
4. Input 0-clock device-check $q0=0$, $q1=0$ The fault coverage for this device is 100% relative to i, and q1, and has been tested q0 with respect to a stuck-at-one fault. A similar procedure is used to test device A with respect to a stuck-at-zero fault.

FAULT RESOLUTION

An existing fault may prevent setting up the proper initialization sequence. For example, in attempting to test for output 2 of a device stuck at one, our initialization sequence could easily require output 2 to be a zero. A property of successor states is that the outputs defined in a given successor state are sensitized relative to that output's predecessor states. This means that output 2 is faulted if it fails to reach a logic zero during the initialization sequence. Thus a test has still been performed.

ASYNCHRONOUS REGISTERS

Registers of a logic device may have asynchronous clear, enable, and set functions. In addition, the clock of a register may be defined by a unique asynchronous term. These features can work to both simplify and complicate the task of automatic test generation. The set and clear functions may help meet the state requirements of a given fault detection vector, or of a given node in the state tree. However, the unique clocking requirements of registers can work to restrict, or even prohibit, a desired state sequencing of the device.

Assume that a given register of a logic device may have up to four features which are asserted when a Boolean product is logically true. These are clock, set, clear, and enable functions. The clock and enable features of a device are restricted to be a function of inputs only. The set and clear features of a register may be a function of outputs if a particular application requires that feature to be negated, and it is possible to negate the feature using inputs. The process of the present invention is easily generalized for cases where these features are expressed in a sum-of-products form.

PRE-PROCESSING REQUIRMENTS FOR ASYNCHRONOUS REGISTERS

For each register of the device a set of product vectors is needed which define how that register may be clocked, set, cleared, or enabled.

CLOCKING REQUIRMENTS

Consider an active high boolean product which is defined to clock a register. This product will be an AND of terms t1 through tN, for an edge level transition there are N unique ways to clock the register. Assuming that the Boolean product starts out logically true, the register may be clocked by toggling t1, or t2, etc. through tN. A total of N transition sets are defined for a register where a transition set indicates a set of product vectors which are compatible with a given primary input, tn, clocking the register. A transition set is constructed for tn as follows. First the set and clear functions must be negated, and the enable function asserted. The set of product vectors which indicate how a function might be negated are obtained by applying DeMorgan's theorem to the Boolean product which described the asserted form of that function. Construct the product vectors which meet the clear, set, and enable requirements for a given output. This is done by intersecting the negate clear product vectors with the negate set product vectors. The resultant expression is intersected with the assert enable product vectors, and then minimized.

Now consider a three-input, one-output device where the clock for the output is given by i1*/i2. Construct a transition set for i1 and i2. by intersecting the product vector (e,0,x,x) with the product vectors which were the result of the clear and set false, and the enable true intersection. The resultant product vectors represent the set of transition product vectors associated with i1. If, as an example, the set of transition product vectors for i1 are given by (e,0,0,x) then it is possible to clock the output by bringing i1 low, and then high. Repeat this process for /i2 by intersecting (1,e,x,x) with the product vectors which were the result of the clear and set false, and the enable true intersection.

REGISTER SET, CLEAR, AND ENABLE

For a register set, it must be ensured that the set and enable functions of a given output are asserted, and that the clear function is negated. The process comprises intersecting the product vectors which describe this state, and save this information relative to each output. For a register clear, collect the product vectors for each output where the enable and clear functions are asserted, and the set function is negated. For an output enable, collect the product vectors for each output where the set and clear functions are negated, and the enable function is asserted.

REQUIREMENTS FOR A TRANSITION IN THE STATE TREE

If registers of a device have asynchronous features, then additional restrictions are required on predecessor state nodes which are considered for entry in a particular state tree. For a three-input, three-output device, assume two product vectors, S and P, represent two state nodes in a state tree. S is the successor state of P. Assume that S has the form (1,x,x,1,0,x), and P has the form (1,1,x,x,0,1). To transition the device from P to S, the following conditions must be met. The outputs q2 and q3 of P must be enabled. Additionally, the set and clear for q2 and q3 must be disabled. Finally, the clocking requirements for outputs q1 and q2 of S must be satisfied. All of these constraints must be compatible with the input assignment of P. Begin by intersecting the input assignment of P with the product vectors which force the enable, set, and clear conditions for q2 and q3. Then intersect these product vectors with the intersection of the transition sets for q1 and q2. The intersection of the transition sets for q1 and q2 are obtained by intersecting the set of product vectors which represent all of the transition sets of q1 with the set of product vectors which represent all of the transition sets of q2. Denote as P' the first non-null intersection between the enable, set, and clear product vectors of P with the transition set product vectors of S. Note that P' satisfies the requirements for a transition from P to S. P' is then entered into the state tree as the predecessor node of S.

ASYNCHRONOUSLY SETTING A STATE NODE

Before proceeding with previous step, it may be possible to take advantage of the clear function of q2 and the set function of q3 to satisfy the output assignment of P. If so, P becomes the first transition of our initialization sequence for a given fault detection vector. Check for this possibility through the following procedure. Intersect the input assignment of P with the product vectors which enable q2 and q3, and those product vectors which clear q2 and set q3. Then intersect these product vectors with the intersection of the transition sets for q1 and q2. If this intersection is not null, it is possible to asynchronously set the output assignment of P and then transition from P to S using the clocking inputs indicated by the intersection of the transition sets of q1 and q2.

AN EXAMPLE USING A J-K FLIP FLOP

The following example is given to present an intuitive overview of the invention. The detailed steps of the invention are ommited. The description of the device is given in the form of a state equation:

$$q(t+1) = j*/q(t) + /k*q(t)$$

where "*" denotes a Boolean AND, and "/" denotes the complement of a term. The goal is to identify all stuck-at-one and stuck-at-zero faults for the inputs j and k, and the output q. The strategy will be to find a state of the device where q is described as a function of j, and another state where q is described as a function of k. Next, determine the initialization sequence to set the j-k flip flop to the desired state for the test.

Beginning with the input j, observe that q(t+1) is a direct function of only the input j when q(t) is logically false. The state where (t) is false is derived by the process used to determine fault detection vectors. The state equation then becomes:

$$q(t+1) = j*1 + 0$$

or $$q(t+1) = j$$

The equation $q(t+1) = j$ is the fault detection equation for j and q. An initialization sequence to set q(t) logically false is now required.

The minimized expression for /q(t) is easily derived using Boolean logic (DeMorgan's theorem) or a karnaugh map of a j-k flip flop: (see FIG. 7)

$$/q(t) = /j*/q(t-1) + k*q(t-1)$$

It is not obvious from this equation how to set q(t) logically false since both product terms are a function of the state of the device at time $t-1$. The operation of consensus allows the derivation of an additional term for /q(t). Applying consensus to /q(t) relative to q(t-1) gives:

$$/q(t) = /j*/q(t-1) + k*q(t-1) + /j*k$$

The process of consensus gives the redundant product term /j*k. This term is necessary because it shows that q(t) can be set false using only inputs. FIG. 7 shows a Karnaugh map which indicates graphically the origin of the redundant product term /j*k.

It is now possible to construct a test sequence to test for static faults on the input j and the output q.

The Test Sequence

A state of the device is now established that satisfies the requirements of the fault detection equation and there is an initialization sequence to arrive at this fault detection state. The test sequence is:

| Initialization | (t − 1) | j = 0, k = 1 |
|---|---|---|
| Fault detection | (t) | q(t) = 0 |
| equation true: | | j = 1 |
| Fault detection for j, q stuck-at-0: | (t + 1) | q(t + 1) = 1 |
| Initialization: | (t − 1) | j = 0, k = 1 |
| Fault detection | (t) | q(t) = 0 |
| equation true: | | j = 0 |
| Fault detection for j, q stuck-at-1: | (t + 1) | q(t + 1) = 0 |

Now identify the fault detection equation where q is described as a function of the input k. Observing q(t) to be logic true, the state equation for the j-k flip flop becomes:

$$q(t+1) = /k$$

Using this equation, a similar procedure is applied to determine the test sequence for static faults involving the input k. The test sequence is determined to be:

| Initialization: | (t − 1) | j = 1, k = 0 |
|---|---|---|
| Fault detection | (t) | q(t) = 1 |
| equation true: | | k = 1 |
| Fault detection for k stuck-at-0, q stuck-at-1: | (t + 1) | q(t + 1) = 0 |
| Initialization: | (t − 1) | j = 1, k = 0 |
| Fault detection | (t) | q(t) = 1 |
| equation true: | | k = 0 |
| Fault detection for k stuck-at-1, q stuck-at-0: | (t + 1) | q(t + 1) = 1 |

If the above test sequences pass, all static pin faults for the j-k flip flop will be identified. Therefore the requirements of in-circuit test for this device are satisfied.

SUMMARY OF ADVANTAGES OF THE PRESENT INVENTION

The process of the present invention therefore provides a unique method of automatic test generation (ATG), for most logic devices which can be described by Boolean state equations, that is economical and fast. This proces may be implemented by computer in either program language or compiled language and quantitatively identifies all stuck-at-one and stuck-at-zero static pin faults while also providing a large degree of test internal fault coverage. The test generated by this process can be used on sequential logic devices and can be adapted to in circuit topology and asynchronous registers.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An automatic test generation process for a device capable of being described by Boolean state equations comprising the steps of:
   describing fault detection equations from said Boolean state equations;
   determining fault detection Boolean products that describe a state where said fault detection equations are true;
   deriving, through the use of pruning, initialization sequences that satisfy the requirements of said fault detection Boolean products so that a first transition of said initialization sequence can be sequenced independent of the state of said device;
   applying said initialization sequence to said device to test said device;
   preprocessing a state description of said device to obtain said Boolean state equations;
   applying DeMorgan's theorem to said Boolean state equations to derive the complements of said Boolean state equations and to obtain minimized logic true and minimized logic false device state equations.

2. The process of claim 1 wherein said step of preprocessing further comprises the step of:

applying consensus to said Boolean state equations based upon the theorem $xy+xz=xy+xz+yz$ to derive additional Boolean products to determine if necessary but not sufficient conditions exist for testing said device.

3. The process of claim 1 wherein said step of deriving said fault detection equations comprises the steps of:

selecting a primary Boolean product from said minimized logic true and minimized logic false device state equations that contains an input to be tested;

defining all Boolean products of said device state equation, other than said primary Boolean product, as secondary Boolean products;

applying DeMorgan's theorem to said secondary Boolean products to produce an expression defining a condition where said secondary Boolean products are logically false;

minimizing said expression to obtain a set of minimized secondary Boolean products.

4. The process of claim 1 wherein said step of deriving said initialization sequences comprises the steps of:

generating predecessor states by performing a Boolean AND operation with said minimized logic true and minimized logic false device state equations of a successor state to obtain a predecessor Boolean expression which meets conditions defined by output assignments of successor states;

eliminating redundant terms from said predecessor Boolean expression.

5. The process of claim 4 wherein said step of eliminating redundant terms comprises the steps of:

eliminating terms from said predecessor Boolean expression that have output assignments that correspond to and are covered by output assignments of Boolean expressions for successor states.

6. The process of claim 5 further comprising the step of:

applying consensus to said predecessor Boolean expression using the theorem $xy+/xz=xy+/xz+yz$ to obtain an expanded predecessor Boolean expression.

7. The process of claim 7 wherein the step of determining said fault detection Boolean products that describe a state where said fault detection equations are true comprises the steps of:

deriving a primary product vector from said primary Boolean product;

representing said minimized secondary Boolean products as secondary product vectors;

intersecting said primary product vector with said secondary product vectors to obtain a set of fault detection vectors that describe a state where said fault detection equations are true.

8. The process of claim 7 further comprising the step of:

applying consensus to output assignments of said set of fault detection vectors to derive additional set of fault detection vectors.

9. The process of claim 8 wherein said step of deriving said initialization sequences comprises the steps of:

sequentially determining predecessor states by:

selecting a predetermined fault detection vector from said additional set of fault detection vectors for deriving an initialization sequence;

determining output assignments of said predetermined fault detection vector;

performing a Boolean AND operation on said minimized logic true and minimized logic false device state equations of a successor state to obtain a set of predecessor state nodes;

minimizing said set of predecessor state nodes by eliminating redundant predecessor state nodes;

applying a process of concensus bases on the theorem $xy+/yz=xy+/xz+yz$ to obtain an expanded set of predecessor state nodes;

eliminating nodes of said predecessor states using the process of pruning by:

reducing said reduced set of predecessor state nodes by eliminating nodes that have redundant output assignments derived from said predetermined fault detection vector to obtain a further reduced set of predecessor state nodes;

reducing said reduced set of predecessor state nodes with respect to covered output assignments based on the theorem $x+xy=x$ to obtain a further reduced set of predecessor state nodes;

reducing said further reduced set of predecessor state nodes by eliminating nodes derived from any other fault detection vector of said set of fault detection vectors for which no initialization sequence exists;

continuing a process of sequentially determining said predecessor states and eliminating nodes of said predecessor states to obtain said initialization sequence.

10. A method of constructing a state tree to describe a sequence of states of a logic device comprising the steps of:

deriving a root state of said logic device;

sequentially deriving previous states of said device;

defining states of said device as product vectors;

placing said product vectors as nodes at levels in accordance with a time sequence in which said states were sequentially derived such that each level contains nodes defining possible states of said logic device at a specified time;

pruning irrelevant nodes from said state tree as each previous state is derived by eliminating nodes that have redundant output assignments and have output assignments that are covered by output assignments in successor state nodes.

11. A method of initializing a device capable of being described by logic equations by determining a predetermined sequence of inputs such that a first transition can be sequenced independent of the state of the device, and a unique predetermined output can be obtained regardless of the initial state of said device by applying said predetermined sequence of inputs to said device comprising the steps of;

deriving fault detection equation from said logic equations;

deriving a fault detection vector that describes a state where said fault detection equations are true to determine said unique predetermined output;

sequentially determining predecessor states from each successor state starting with said unique predetermined output;

eliminating nodes of predecessor states that have redundant output in successor state nodes;

eliminating nodes of predecessor states that are covered by outputs of successor state nodes as a result of irrelevant outputs;

continuing said process of sequentially determining predecessor states and eliminating nodes of predecessor states until a predecessor state is found having all irrelevant outputs to derive said predetermined sequence of inputs.

* * * * *

UNITED STATES PATENT AND TRADEMARK OFFICE
CERTIFICATE OF CORRECTION

PATENT NO.   :   4,853,928

DATED        :   August 1, 1989

INVENTOR(S)  :   Wayne R. Williams

It is certified that error appears in the above-identified patent and that said Letters Patent is hereby corrected as shown below:

Column 3, line 35, "outpus" should read -- outputs --;

Claim 7, line 1, "The process of claim 7" should read
          -- The process of claim 3 --.

Signed and Sealed this

Twenty-eighth Day of May, 1991

*Attest:*

HARRY F. MANBECK, JR.

*Attesting Officer*     *Commissioner of Patents and Trademarks*